(12) United States Patent
Vervuurt et al.

(10) Patent No.: US 10,720,334 B2
(45) Date of Patent: Jul. 21, 2020

(54) SELECTIVE CYCLIC DRY ETCHING PROCESS OF DIELECTRIC MATERIALS USING PLASMA MODIFICATION

(71) Applicant: ASM IP Holding B.V., Almere (NL)

(72) Inventors: Rene Henricus Jozef Vervuurt, Tokyo (JP); Nobuyoshi Kobayashi, Kwagoe (JP); Takayoshi Tsutsumi, Nagoya (JP); Masaru Hori, Nissin (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 16/041,044

(22) Filed: Jul. 20, 2018

(65) Prior Publication Data

US 2020/0027740 A1    Jan. 23, 2020

(51) Int. Cl.

| | | |
|---|---|---|
| *H01L 21/306* | (2006.01) | |
| *H01L 21/3065* | (2006.01) | |
| *H01L 21/3213* | (2006.01) | |
| *C23C 16/02* | (2006.01) | |
| *B81C 1/00* | (2006.01) | |
| *C30B 31/00* | (2006.01) | |
| *C30B 33/08* | (2006.01) | |
| *C30B 33/12* | (2006.01) | |
| *H01L 21/311* | (2006.01) | |
| *H01L 21/308* | (2006.01) | |
| *H01L 21/3105* | (2006.01) | |

(52) U.S. Cl.
CPC ...... *H01L 21/3065* (2013.01); *B81C 1/00595* (2013.01); *C23C 16/0245* (2013.01); *C30B 31/00* (2013.01); *C30B 33/08* (2013.01); *C30B 33/12* (2013.01); *H01L 21/3081* (2013.01); *H01L 21/31053* (2013.01); *H01L 21/31105* (2013.01); *H01L 21/31127* (2013.01); *H01L 21/32137* (2013.01)

(58) Field of Classification Search
CPC .......... H01L 21/3065; H01L 21/31127; H01L 21/31105; H01L 21/31053; H01L 21/3081; H01L 21/32137; C30B 33/12; C30B 33/08; C30B 31/00; B81C 1/00595; C23C 16/0245
See application file for complete search history.

(56) References Cited

U.S. PATENT DOCUMENTS

| | | |
|---|---|---|
| 2007/0080141 A1 | 4/2007 | White et al. |
| 2007/0113868 A1 | 5/2007 | Fu et al. |
| 2007/0161214 A1 | 7/2007 | Fompeyrine et al. |

(Continued)

OTHER PUBLICATIONS

U.S. Appl. No. 16/040,859, filed Jul. 20, 2018, Vervuurt et al.

(Continued)

*Primary Examiner* — Duy Vu N Deo
(74) *Attorney, Agent, or Firm* — Knobbe, Martens, Olson & Bear LLP

(57) ABSTRACT

In some embodiments, a selective cyclic (optionally dry) etching of a first surface of a substrate relative to a second surface of the substrate in a reaction chamber by chemical atomic layer etching comprises forming a modification layer using a first plasma and etching the modification layer. The first surface comprises carbon and/or nitride and the second surface does not comprise carbon and/or nitride.

31 Claims, 14 Drawing Sheets

(56) References Cited

U.S. PATENT DOCUMENTS

| | | | |
|---|---|---|---|
| 2015/0108472 A1* | 4/2015 | Suzawa | H01L 29/78648 |
| | | | 257/43 |
| 2015/0228495 A1 | 8/2015 | Joubert et al. | |
| 2015/0270140 A1 | 9/2015 | Gupta et al. | |
| 2016/0035581 A1* | 2/2016 | Posseme | H01L 21/306 |
| | | | 438/705 |
| 2016/0064387 A1* | 3/2016 | Jeong | H01L 27/1104 |
| | | | 257/401 |
| 2016/0181117 A1 | 6/2016 | Arghavani et al. | |
| 2016/0314986 A1 | 10/2016 | Tominaga et al. | |
| 2017/0084456 A1 | 3/2017 | Olsen et al. | |
| 2017/0178921 A1 | 6/2017 | Takeda et al. | |
| 2017/0186621 A1 | 6/2017 | Zaitsu | |
| 2017/0256500 A1 | 9/2017 | Park et al. | |
| 2017/0345673 A1 | 11/2017 | Ranjan et al. | |
| 2017/0345674 A1 | 11/2017 | Ranjan et al. | |
| 2018/0337138 A1 | 11/2018 | Luu et al. | |
| 2018/0350620 A1 | 12/2018 | Zaitsu et al. | |
| 2020/0027746 A1 | 1/2020 | Vervuurt et al. | |

OTHER PUBLICATIONS

Lee et al., Selectivity in Thermal Atomic Layer Etching Using Sequential, Self-Limiting Fluorination and Ligand-Exchange Reactions, Chem. Mater. 2016, vol. 28, pp. 7657-7665.

Lee et al., Thermal Atomic Layer Etching of Titanium Nitride Using Sequential, Self-Limiting Reactions: Oxidation to $TiO_2$ and Fluorination to Volatile $TiF_4$, Chem. Mater. 2017, vol. 29, pp. 8202-8210.

Office Action dated Apr. 22, 2019 in U.S. Appl. No. 16/040,859.

Office Action dated Sep. 26, 2019 in U.S. Appl. No. 16/040,859.

Sherpa et al., "Quasiatomic layer etching of silicon nitride with independent control of directionality and selectivity", J. Vac. Sci. Technol. A, vol. 35, No. 5, Sep./Oct. 2017, pp. 05C310-1-05C310-8.

Sherpa et al., "Quasi-atomic layer etching of silicon nitride", J. Vac. Sci. Technol. A, vol. 35, No. 1, Jan./Feb. 2017, pp. 01A102-1-01A102-6.

Notice of Allowance dated Mar. 16, 2020, issued in U.S. Appl. No. 16/040,859, 8 pages.

Supplemental Notice of Allowability dated May 8, 2020, issued in U.S. Appl. No. 16/040,859, 5 pages.

* cited by examiner

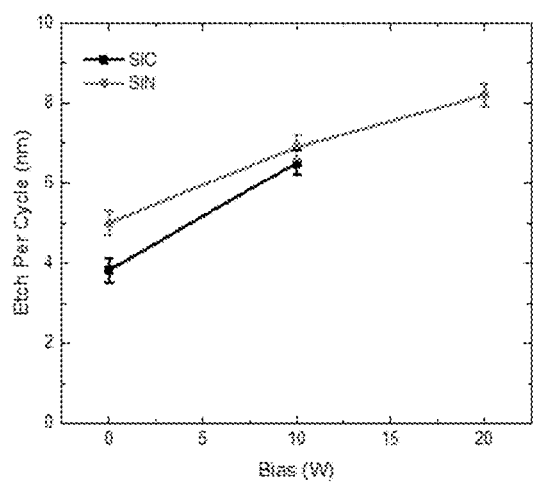
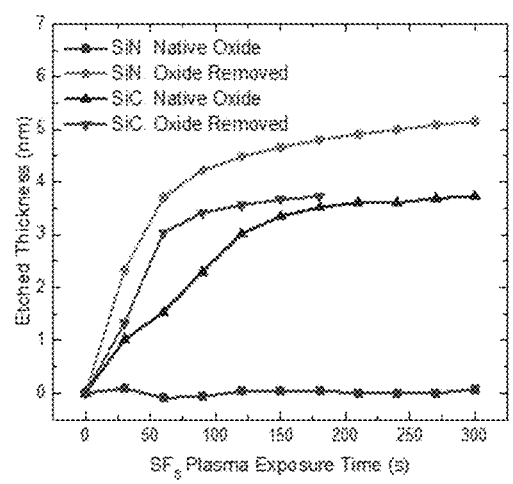
FIG. 4A                    FIG. 4B

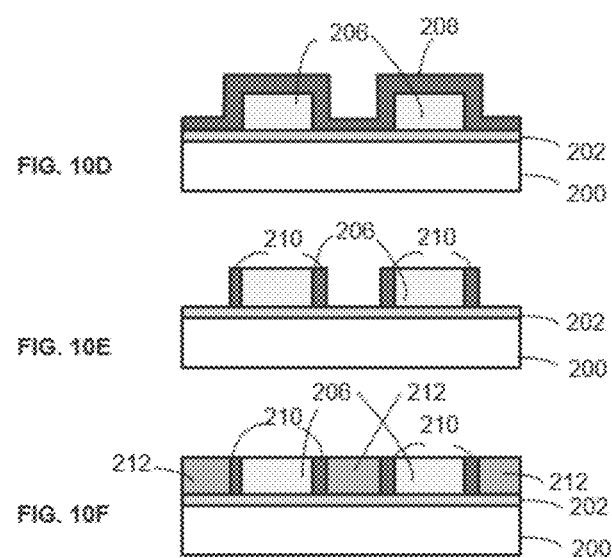

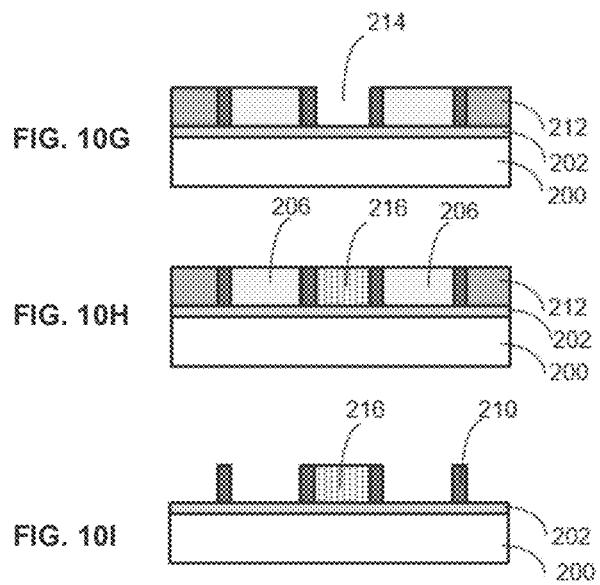

US 10,720,334 B2

SELECTIVE CYCLIC DRY ETCHING PROCESS OF DIELECTRIC MATERIALS USING PLASMA MODIFICATION

BACKGROUND OF THE INVENTION

Field of the Invention

The present application relates to etching processes, more particularly to selective etch processes of carbon (and/or nitrogen containing) vs. non-carbon-containing (or non-nitride containing) materials.

Background

Dielectric materials such as $SiO_2$ and SiN have been used in semiconductors as interlayer dielectrics of interconnects, diffusion barriers and etch hard masks. Conventional etch processes rely heavily on reactive ion etching (RIE). RIE is favorable for the etching of thick dielectrics (>100 nm) due to the high etch rate, but precise control of the etch selectivity and the uniformity is relatively difficult for the etching of thin dielectrics (<100 nm).

SUMMARY OF THE INVENTION

In some embodiments, a selective cyclic etch of a first surface of a substrate relative to a second surface of the substrate in a reaction chamber by chemical atomic layer etching comprises forming a modification layer using a first plasma and etching the modification layer. The first surface comprises carbon and/or nitride and the second surface does not comprise carbon and/or nitride. In some embodiments, the first surface comprises oxide and the second surface does not comprise oxide.

In some embodiments, a selective and uniform cyclic etch process of carbon (and/or nitride) containing materials compared to non-carbon (and/or non-nitrogen) containing materials is provided. The method comprises providing a first surface that comprises carbon (and/or nitride), providing a second surface that lacks carbon (and/or nitride), and treating both the first and second surface with at least one of: a) a plasma assisted process with ions and/or radicals to form a plasma modified layer, or b) a thermal reaction with reactant gas to form a plasma modified layer. The method further comprises treating both the first and the second surface with at least one of: c) plasma etching of the modification layer by fluorine or chlorine containing plasma (or by a halogen source generally), d) plasma etching of the modification layer by hydrogen containing plasma, and e) thermal etching of the modification layer by fluorine or chlorine containing gas.

BRIEF DESCRIPTION OF THE DRAWINGS

FIG. 2 shows modification for SiN & SiC. This, combined with FIG. 9, indicates that by changing the Plasma one can tune the etch selectivity between SiN, SiC & SiO.

FIG. 4A is a graph illustrating the effect of changing substrate bias on the etched thickness per cycle (EPC).

FIG. 4B is a graph comparing the effect of changing $SF_6$ microwave plasma time on etched thickness per cycle (EPC) before and after surface oxide is removed.

FIGS. 10A-10I are cross-sections illustrating a method for the processing of a substrate according to an embodiment of the invention.

DETAILED DESCRIPTION OF THE PREFERRED EMBODIMENT

Various methods of RIE (reactive ion etching) of the dielectrics exist. However, many of these RIE methods provide limited etch-selectivity and uniformity control, which would be insufficient for possible future technology nodes that may extend beyond 10 nm. In addition, as noted above, RIE is favorable for the etching of thick dielectrics, but precise control of the etch selectivity and the uniformity is relatively difficult for the etching of thin dielectrics (<100 nm). This is even more difficult in carbon containing materials, such as SiC, SiCN, SiCO and SiCOH and there are currently no a suitable atomic layer etching processes available to solve these problems.

Some of the embodiments provided herein use other chemistries and/or provide improved process control. Some embodiments provided herein provide a method of etch selectivity for atomic layer etching, regarding carbon (and/or nitride) containing material vs material that lacks carbon (or material that includes an oxide coating and/or lacks nitride). Some embodiments provide a method of etch selectivity for atomic layer etching, regarding oxide containing material vs material that lacks oxide.

In some embodiments, a method of selectively etching a film is provided. The etching of the film is done such that a first surface is etched relatively more compared to a second surface. This can be done in a reaction chamber by atomic layer etching. In some embodiments, this is achieved by forming a modification layer using a first plasma and then etching the modification layer. The method can comprise one or more cyclic dry etch process. For selectivity, the first surface can comprise carbon (and/or nitride) while the second surface will not contain carbon (and/or nitride) (e.g., will be relatively carbon free and/or will include an oxide coating).

Figure 1:
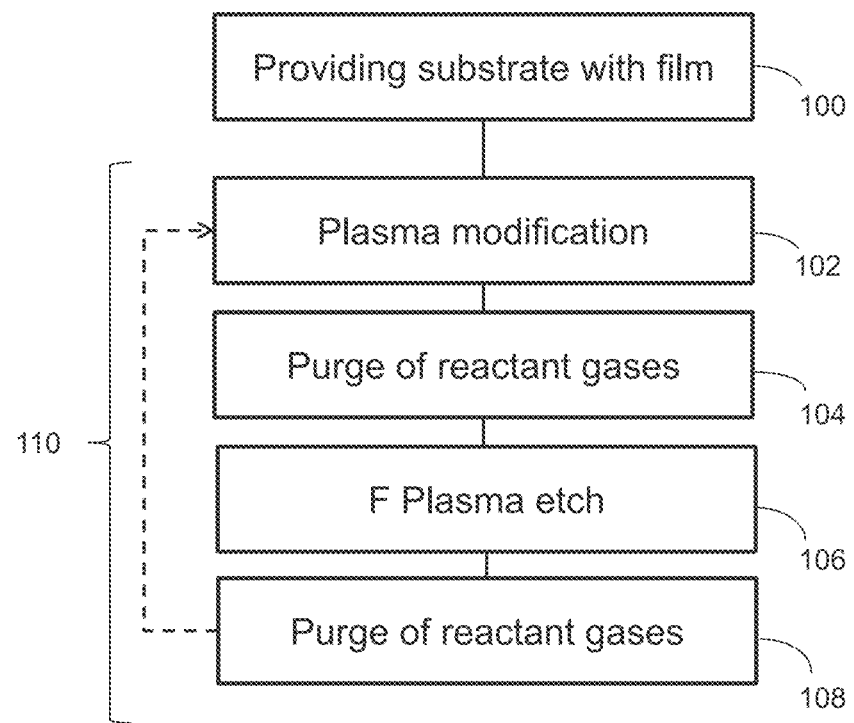
FIG. 1 is a process flow diagram illustrating the processing of a substrate according to an embodiment of the disclosed technology.

FIG. 1 is a process flow diagram illustrating some embodiments of processing a substrate. A film is provided onto a substrate 100. A plasma modification 102 is performed on the substrate (over the film). Reactant gases are purged 104 prior to subjecting the substrate (and the film) to a fluorine plasma etch 106. Reactant gases are purged 108. This results in selective dry etching 110 when a first part of the surface of the film contains carbon (and/or nitride) and a second part of the surface of the film does not contain carbon (and/or nitride). Plasma modification 102, purging reactant gases 104, fluorine plasma etch 106, and purging reactant gases 108 can be cyclic. That is, selective dry etching 110 can be repeated at least one and optionally a plurality of times. The cyclic etch can be repeated until the desired layer thickness is obtained.

Figure 2A:
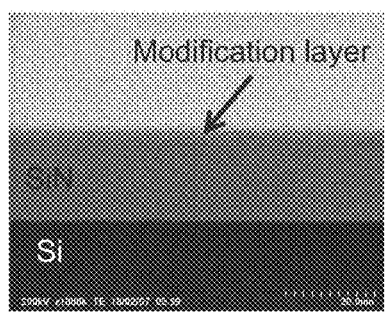
FIGS. 2A-2C are STEM photographs illustrating the formation of modification layers on SiN and SiC, but not on SiO, after being exposed to $H_2$ plasma. The structure in FIG. 2 is the result of $H_2$ plasma exposure on SiC, SiN & SiO.
Figure 2B:
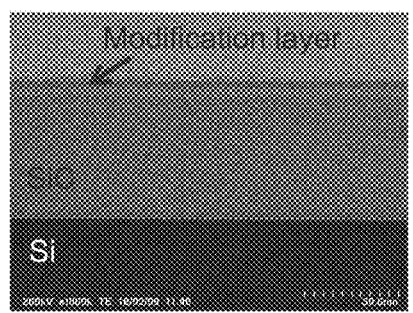
Figure 2C:
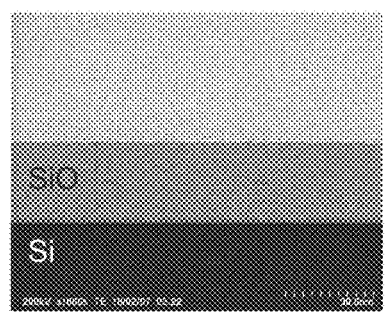

FIGS. 2A-2C are STEM photographs illustrating SiN, SiC, and SiO layers after they are exposed to a $H_2$ plasma for the formation of a modification layer. Surface oxides were not removed prior to the $H_2$ plasma. Surface oxides are removed by SF6 plasma which is generated in CCP type reactor. These SiN, SiC and SiO films with thickness of 30 nm are deposited on the Si substrate by PECVD at 300 C. FIG. 2A illustrates the formation of a modification layer on SiN. FIG. 2B illustrates the formation of a modification layer on SiC. The H2 plasma modification is conducted with RF power of 100 W at 2 Pa. Because surface oxides were not removed prior to the $H_2$ plasma, two layers of can be seen on top of SiC in FIG. 2B. FIG. 2C illustrates that there is no formation of a modification layer on SiO. The modification layer can be removed by fluorine plasma exposure (or any of the other etch options provided herein).

Figure 3:
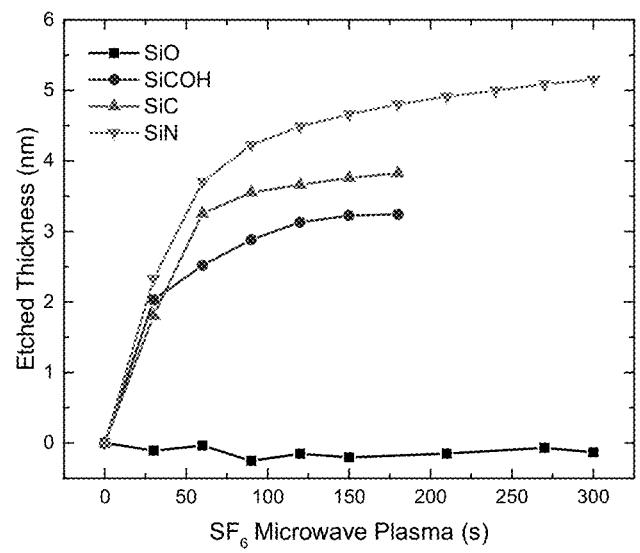
FIG. 3 is a graph illustrating the etched thickness of SiO, SiCOH, SiC and SiN using atomic layer etching with $H_2$ plasma and fluorine radicals.

FIG. 3 is a graph illustrating the etched thickness of SiO, SiCOH, SiC and SiN using atomic layer etching with $H_2$ plasma and fluorine radicals. The SiO, SiOCH, SiC, SiN films are deposited on the Si substrate by PECVD or ALD. The etched thickness is a function of the period of time of $SF_6$ microwave plasma applied. After surface oxide removal, SiN, SiC and SiCOH can be etched, with selectivity between the different compounds. It can be observed that the etched thickness initially rapidly increases as a function SF6 microwave plasma time but gradually saturates for longer exposure times showing the self-limiting behavior of the etch process It is possible to tune the selectivity between materials by changing $H_2$ plasma bias power, pressure or pre-treatment. For SiN, the removal of surface oxide is required to obtain etching. For SiC, the removal of surface oxide is not needed. Selectivity between SiN and SiC, can therefore be increased by not doing a pre-clean treatment. In other words, the atomic layer etching is strongly affected by the presence of surface oxide. Therefore oxygen species should be avoided from the plasma in the modification plasma and F radical etch process, because oxygen inclusion easily forms a surface oxide, which results in the suppression of the etch.

FIG. 4A is a graph illustrating the effect of changing substrate bias on the etched thickness per cycle ("EPC"). As $H_2$ bias power is increased, the increase in EPC of SiC is higher than the increase in EPC of SiN. FIG. 4B is a graph illustrating the effect of changing pre-treatment on the EPC. As the period of time that $SF_6$ microwave plasma is increased, the EPC of SiC increases and gradually saturated. EPC is slightly higher when the surface oxide is not removed as compared to when the surface oxide is removed for SiC. As the period of time that $SF_6$ microwave plasma is increased, the EPC of SiN does not increase when a surface oxide is present. EPC is higher when the surface oxide is removed as compared to when the surface oxide is not removed for SiN. The difference between EPC of SiC and SiN when the surface oxide is not removed becomes bigger as the period of time that $SF_6$ microwave plasma is on increases, which can help with selectivity in etching between SiC and SiN. EPC increases at different rates for different materials as bias power increases. Thus, altering bias power can further allow for greater selectivity between a first surface and a second surface. It is further contemplated herein that EPC increases at different rates as the time that plasma is applied increases. In some embodiments, selective etching can occur between more than just two difference surfaces. In some embodiments, 2, 3, 4, 5, 6 or more different surfaces can all be etched with different selectivity.

Figure 5A:
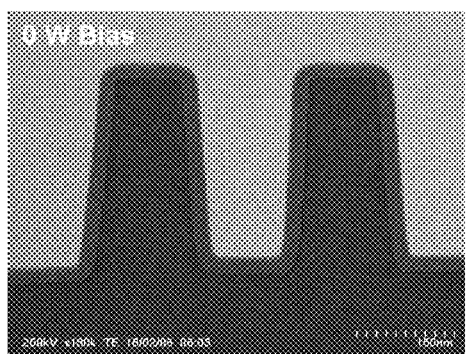
FIG. 5A is a STEM photograph illustrating the modification layer formation on a SiN recess pattern after $H_2$ plasma exposure.
Figure 5B:
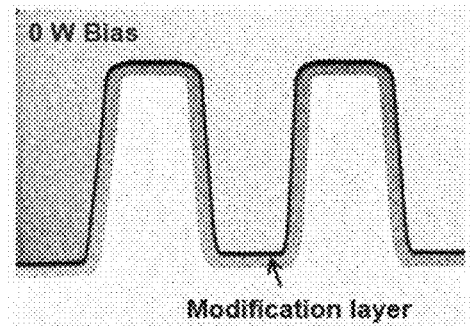
FIG. 5B is a STEM high contrast image of FIG. 5A.
Figure 5C:
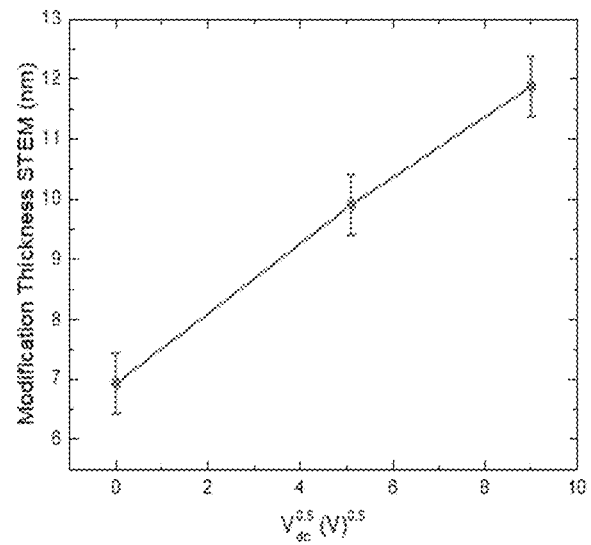
FIG. 5C is a graph illustrating the modification layer thickness as a function of applied bias.

FIG. 5A is a STEM photograph illustrating a modification layer that is formed from the $H_2$ plasma modification, which is formed on a SiN recess pattern. 20 nm thick SiN film is deposited on a Si recess pattern by PEALD at 300 C. FIG. 5B is a STEM photograph illustrating a high contrast image of FIG. 5A. FIG. 5C is a graph illustrating the modification layer thickness as a function of applied bias.

Figure 6A:
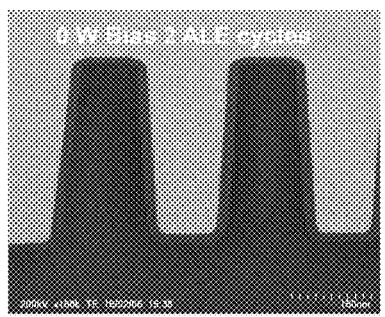
FIGS. 6A-6C are STEM photographs illustrating the effect of bias applied on SiN during the plasma modification step on the etch profile after two cycles.
Figure 6B:
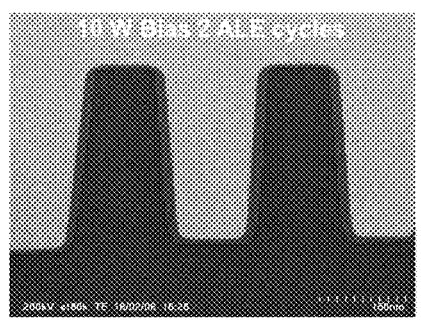
Figure 6C:
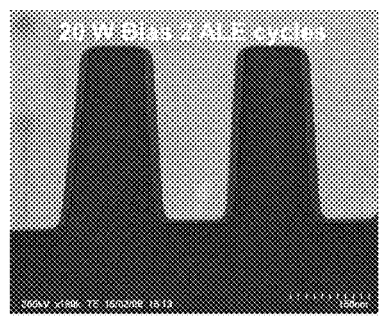

FIGS. 6A-6C are STEM photographs illustrating the impact of bias applied on SiN during the plasma modification step on the etch profile after two ALE cycles. FIG. 6A illustrates the plasma modification when a bias of 0 W is applied after two ALE cycles. FIG. 6B illustrates the plasma modification when a bias of 10 W is applied after two ALE cycles. FIG. 6C illustrates the plasma modification when a bias of 20 W is applied after two ALE cycles. In all of FIGS. 6A-6C, a pre-clean step removing the oxide was performed prior to applying the bias. In some embodiments, an initial profile can be added before the etch, if desired. In some embodiments, the thickness on the top surface is reduced with an increase in bias, whereas the thickness on the side surface is less impacted.

Figure 7A:
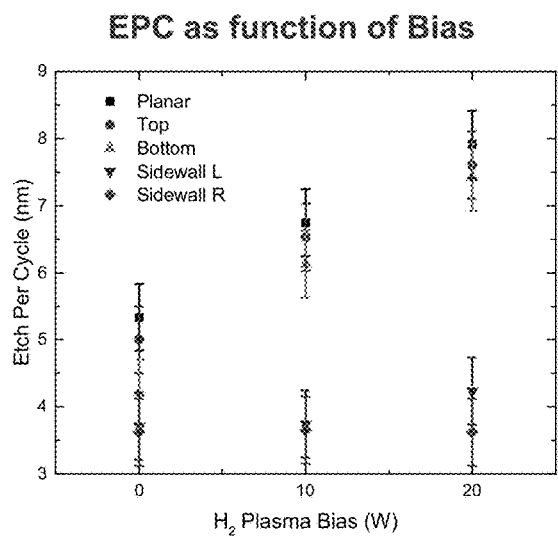
FIG. 7A is a graph illustrating EPC as a function of bias.
Figure 7B:
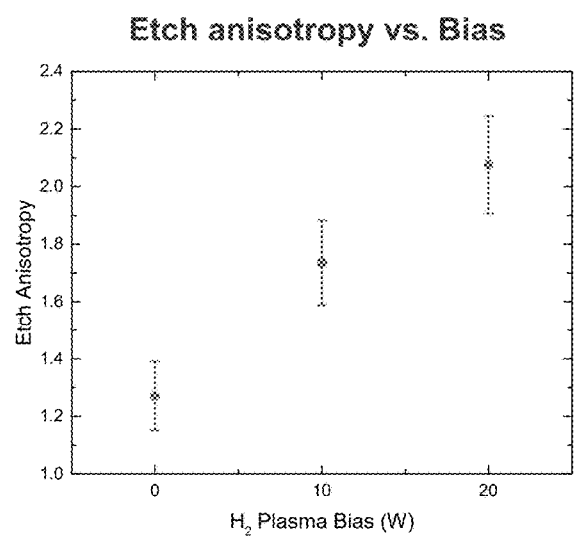
FIG. 7B is a graph illustrating etch anisotropy as a function of bias.

FIG. 7A is a graph illustrating EPC of SiN as a function of bias during the plasma modification step on different parts of the recess pattern. The planar part of the recess pattern has the highest etch per cycle, the top part of the recess pattern has the second highest etch per cycle, bottom part of the recess pattern has the third highest etch per cycle, left sidewall has the second lowest etch per cycle and right sidewall has the lowest etch per cycle. FIG. 7B is a graph illustrating etch anisotropy as a function of bias as applied to SiN. As $H_2$ plasma bias is increased, etch anisotropy is increased. In both FIG. 7A and FIG. 7B, the substrate underwent a pre-clean step removing surface oxides prior to being treated with $H_2$ plasma bias. It is contemplated herein that EPC is different for different materials when the bias is applied and that the increase in EPC is different for different materials as bias is increased.

FIG. 8 is a graph illustrating etched thickness of SiC after $N_2$ plasma treatment as a function of the period of time of SF6 microwave plasma. $N_2$ plasma treatment is conducted at RF power of 100 W at 2 Pa, or $N_2$ plasma at 50 W, 2 Pa, or $N_2$ plasma at 25 W, 2 Pa. As the RF power of N2 plasma treatment is increased, the etched thickness of SiC increases.

Figure 9A:
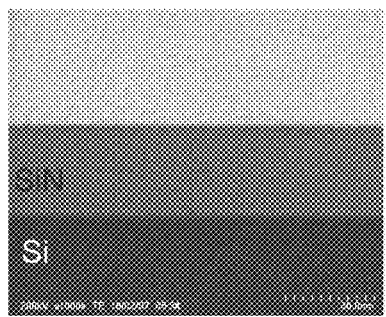
FIGS. 9A-9C are STEM photographs illustrating the formation of a modification layer on SiC, but not on SiN or SiO after N2 plasma exposure. The structure in FIG. 9 is the result of N2 plasma exposure for SiC. This, combined with FIG. 2, indicates that by changing the Plasma one can tune the etch selectivity between SiN, SiC & SiO
Figure 9B:
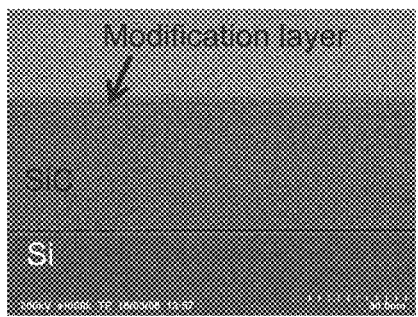
Figure 9C:

FIGS. 9A-9C are STEM photographs illustrating the formation of a modification layer on SiC, but not on SiN or SiO after $N_2$ plasma exposure. FIG. 9A illustrates that no modification layer was formed on SiN. FIG. 9B illustrates that a modification layer was formed on SiC. FIG. 9C illustrates that a modification layer was formed on SiO. Surface oxide was not removed before modification. Because there is no modification layer observed for SiN, an etch-selectivity between SiC and SiN can be observed after N2 plasma treatment. The modification layer can be removed by fluorine plasma exposure.

As noted herein, a modification layer is formed on SiC when the SiC is exposed to $N_2$ plasma or $H_2$ plasma. A modification layer is not formed on SiO when the SiO is exposed to $N_2$ and $H_2$ plasma. A modification layer is formed on SiN is exposed to $H_2$ plasma, but not $N_2$ plasma. It is contemplated herein that by changing the source of the plasma, the selectivity of etching between two materials can be affected. It is also contemplated herein that by adding a pre-clean step, such as removing an oxide layer, the selectivity of etching between two materials can also be affected.

Figure 10A:
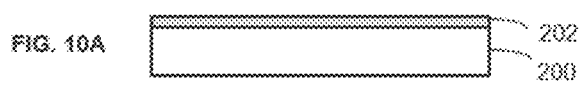
Figure 10B:
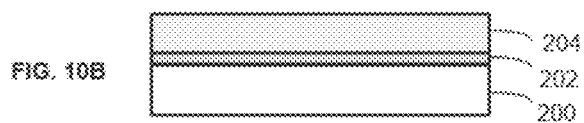
Figure 10C:
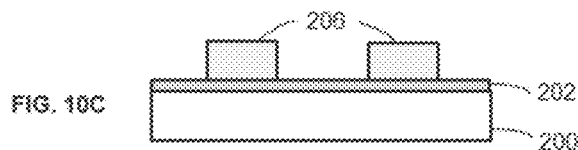

FIGS. 10A-10I are cross-sections of recess patterns illustrating a method for the processing of a substrate according to an embodiment of the invention with self-aligned spacer and block patterning. As shown in FIG. 10A, a layer of $Al_2O_3$ 202 is deposited on a substrate 200 by thermal ALD. As shown in FIG. 10B, $SiO_2$ layer 204 is deposited on the $Al_2O_3$ layer 202 by PEALD. As shown in FIG. 10C, the $SiO_2$ layer 204 is patterned by the conventional ArF immersion lithography and the atomic layer etching to form patterned $SiO_2$ 206. $Al_2O_3$ 202 works for the etching stop layer in the atomic layer etching of $SiO_2$.

In FIG. 10D, a SiN layer 208 is deposited conformaly by plasma-enhanced atomic layer deposition (PEALD) on the patterned $SiO_2$ 206. The patterned $SiO_2$ 206 sits on top of the $Al_2O_3$ layer 202, which sits on top of the substrate 200. In FIG. 10E, a cyclic dry etch of SiN layer 208 with H2 plasma modification and F radical etch is performed using spacer patterning such that a patterned layer of SiN 210 remains. The patterned SiN layer 210 sits on top of the $Al_2O_3$ layer 202, which sits on top of the substrate 200. In FIG. 10F, SiC 212 is deposited by CVD for gap-fills process around the SiN pattern 210. The SiC 212 in the flat area is removed by CMP (Chemical Mechanical Polishing) to form the SiC gap fill. The SiC 212 gap fill, the patterned SiN layer and the patterned $SiO_2$ 206 sit on top of the $Al_2O_3$ layer 202, which sits on top of the substrate 200.

In FIG. 10G, block patterning occurs by the conventional ArF immersion lithography and SiC is removed by cyclic etch with H2 plasma modification and F radical etch to reveal gap 214. The gap sits on top of the $Al_2O_3$ layer 202, which sits on top of the substrate 200. In FIG. 10H, ZnO 216 is deposited by ALD and ZnO 216 in the flat area is removed by CMP to form the ZnO gap 214. ZnO 216 sits on top of the $Al_2O_3$ layer 202, which sits on top of the substrate 200. In FIG. 10I, $SiO_2$ 206 and SiC 212 are removed by the atomic layer etching where SiN 206, ZrO 216, $Al_2O_3$ 202 is not etched due to the high selectivity. This results in patterned SiN layer 210 and ZnO 216 sitting on top of the $Al_2O_3$ layer 202, which sits on top of the substrate 200. The substrate comprise typically Si containing substrate such as Si, $SiO_2$, SiCN, SiOC, SiOCH. By using the atomic layer etching with these films as a hard mask, the substrate is patterned as the SADP (self-aligned double pattern) and SAB (self-aligned block) process. In this embodiments, the atomic layer etching using $H_2$ plasma modification and F or Cl radicals is used with the high etch selectivity among various kinds of dielectrics such as $Al_2O_3$, $SiO_2$, SiN, SiC, and ZrO.

In some embodiments, the first plasma can be a hydrogen containing plasma. For example, the hydrogen containing plasma comprises $H_2$, $NH_3$, $H_2$/Ar, or $H_2/N_2$ In some embodiments, the first plasma (for the creation of the modification layer) can be a hydrogen, helium, and/or a nitride containing plasma. In some embodiments, the plasma etch of the modification layer can be achieved by a fluorine or chlorine containing plasma or fluorine or chlorine containing gas.

In some embodiments, subsequent etching of the modification layer can comprise a thermal etch by fluorine or chlorine containing gas. For example, the fluorine containing gas can comprise $XeF_2$ or HF. Etching of the modification layer can also occur by a method that uses plasma that contains fluorine. For example, the fluorine containing plasma can comprise $SF_6$ or $NF_3$, and the chlorine containing plasma can compromise BCl3 or SOCl2. The fluorine and chlorine containing plasma can be generated by a microwave plasma source.

The above noted etch process can result in high selectivity between the first surface and the second surface. For example, when the first surface comprise carbon (and/or nitride) and the second surface does not comprise carbon (and/or nitride), the dry etch process can result in high selectivity between the carbon-containing (and/or nitride-containing) first surface over the non-carbon (and/or non-nitride) containing second surface.

The carbon-containing (and/or nitride-containing) material can further comprise silicon. For example, the carbon and silicon containing material can include SiC, SiCN, or SiCOH. The carbon-containing (and/or nitride-containing) material can further comprise metal. In some embodiments, the degree of etching can also be selective between different carbon (and/or nitride) containing materials. That is, for example, the first surface can be a first carbon (and/or nitride) containing material and the second surface can be a different carbon (and/or nitride) containing material. In some embodiments, the first surface is SiN or SiC and the second surface is, for example, SiCOH. In some embodiments, the first surface is SiCOH or SiC and the second surface is SiO. In some embodiments, the carbon (and/or nitride) containing surface can also include a metal. In some embodiments, the carbon (and/or nitride) and metal containing material can include TiC, HfC, WC, or MoC. In some embodiments, the carbon (and/or nitride) and metal containing material can include TiN, HfN, etc for using $H_2$ plasma in combination with F plasma. In some embodiments, material can be etched, so long as the metal-fluoride is volatile. In some embodiments, a third reaction step can be employed. For example, removing the surface fluoride by Ar ion bombardment, or a reaction with another chemical that creates a volatile product.

In some embodiments, the second surface (e.g., non-carbon containing and/or non-nitride containing) can comprise materials that contain oxides, or nitrides, or a combination of oxides and nitrides. For example, the oxide containing material can include titanium oxide, hafnium oxide, tungsten oxide, or molybdenum oxide.

In some embodiments, any desired level of selectivity can be achieved by selecting the desired relative compositions for the two surfaces. Selectivity can be expressed as a percentage calculated by [(etching on a first surface)−(etching on a second surface)]/(etching on the first surface). For example, selectivity of a carbon (and/or nitride) containing first surface relative to a non-carbon (and/or non-nitride) containing second surface can be expressed as [etching on the carbon containing first surface−etching on the non-carbon (and/or non-nitride) containing second surface/etching on the carbon (and/or nitride) containing first surface. In some embodiments, EPC can be used as a measure of etching on the first surface or etching on the second surface.

Selectively etching of a first surface relative to a second surface can mean that the selectivity is preferably over 50%, 55%, 60%, 65%, 70%, 75%, 80%, 90%, and in some cases the selectivity can be over 95% or even over 98%. In some embodiments the selectivity can be 99%, 99.9%, 99.99% or even more. In some embodiments, while the first surface can be identified as being etched, no detectable or statistically significant etching can be observed for the second surface.

In some embodiments, the cyclic dry etch (or wet etch) process can comprise modifying the substrate with a plasma containing nitride. For example, the nitride containing plasma can comprise $N_2$, or $N_2/Ar$. The cyclic dry etch process can be repeated more than one time.

In some embodiments, the atomic layer etching ("ALE") methods disclosed herein are thermal etching processes, as opposed to plasma etching processes. Thus, plasma reactants need not be used in the ALE etch cycles. While referred to as thermal ALE processes to differentiate processes that use plasma reactants, in some embodiments, the ALE reactions may have zero activation energy and therefore may not require any additional thermal energy. Thus, such reactions that do not use plasma reactants may also be referred to as chemical etching processes herein. Thermal ALE methods can be more desirable in some situations than plasma ALE methods because thermal ALE methods can be less damaging to the underlying substrate. Also, thermal ALE methods allow for isotropic etching of non-line of sight (NLOS) features. Thus, all plasma methods provided herein can also be exchanged for thermal ALE methods.

In some embodiments, following each round of etching, excess reactants and any reaction byproducts are removed from the proximity of the substrate surface. The excess reactants and any reaction byproducts may be removed from the proximity of the substrate or substrate surface with the aid of a purge gas and/or vacuum. In some embodiments, excess reactants and/or reactant byproducts are removed from the reaction space by purging, for example, with an inert gas. In some embodiments, the substrate may be moved in order to facilitate removal of the reactant and/or reactant byproducts from the vicinity of the substrate or substrate surface, for example, by moving the substrate to a different reaction chamber.

In some embodiments, reactants gases are purged after plasma modification and after fluorine plasma etch during the cyclic dry etch process. In some embodiments, reactant gases are purged after the plasma modification. In some embodiments, the reactant gases are purged after the fluorine plasma etch. In some embodiments, the purging of reactant gases are repeated a plurality of times during the cyclic dry etch process.

In some embodiments, the conformality of the etching process can be very good, and material can be removed evenly from all surfaces of a three-dimensional structure. In some embodiments, the conformality of etching vertically is greater than about 90% and the conformality of etching horizontally is greater than about 92%. In some embodiments, conformality of etching in vertical openings is about 50% or greater, about 75% or greater, about 85% or greater, about 90% or greater, about 95% or greater, about 98% or greater, about 99% or greater, and even up to about 100%. In some embodiments, conformality of etching in openings extending horizontally (for example from vertical openings), is about 50% or greater, about 75% or greater, about 85% or greater, about 90% or greater, about 95% or greater, about 98% or greater, about 99% or greater, and even up to about 100%. In some embodiments, conformality for a 3D structure, such as a horizontal or lateral cavity, can be greater than 50%, or greater than 80%, or even greater than 90%, or even higher than 99% and even up to about 100%. In some embodiments, conformality can be about 100%.

In some embodiments, the substrate comprising a material to be etched, such as a semiconductor workpiece, is loaded into a reaction space or reactor. In some embodiments, the reactor may be part of a cluster tool in which a variety of different processes in the formation of an integrated circuit are carried out. In some embodiments, a flow-type reactor is utilized. In some embodiments, a cross-flow reactor is used. In some embodiments, a shower head type of reactor is utilized. In some embodiments, a space divided reactor is utilized. In some embodiments, a high-volume manufacturing-capable single wafer atomic layer deposition reactor is used. In some embodiments, a batch reactor comprising multiple substrates is used. In some embodiments, the wafer chuck is biased. In some embodiments, the plasma employed is an in situ plasma. In some embodiments, the etching is spacer-etching and is directional.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc. of Phoenix, Ariz. and ASM Europe B.V., Almere, Netherlands. Other commercially available reactors include those from ASM Japan K.K (Tokyo, Japan) under the tradename Eagle® XP and XP8. In some embodiments, the reactor is an etch reactor.

In some embodiments, if necessary, the exposed surfaces of the workpiece can be pretreated to provide reactive sites to react with the first phase of the ALE process. In some embodiments, a separate pretreatment step is not required. In some embodiments the substrate is pretreated to provide a desired surface termination. In some embodiments the substrate is pretreated with plasma.

In some embodiments, ALE is performed below the deposition temperature of the material to be etched. For plasma ALE lower temperatures are better as it avoids thermal etching. In some embodiments, ALE cycles may be performed at temperatures ranging from about 20 to about 1200° C., about 50 to about 800° C., about 75 to about 600° C., about 300° C. to about 500° C., or from about 350° C. to about 450° C. In some embodiments, the temperature is greater than about 20, 50 or 100° C., but less than about 1000, 800, 600 or 500° C. In some embodiments, the cycles are carried out at a temperature of about 450° C.

The pressure in the reaction chamber is typically from about 10E-9 torr to about 760 torr, or about 0.001 to about 100 torr. However, in some cases, the pressure will be higher or lower than this range, as can be determined by the skilled artisan given the particular circumstances. In some embodiments, a pressure of less than 2 torr is utilized. In some cases the reactor can be operated either in isothermal (such as hot-wall) or non-isothermal (such as cold-wall) conditions. In some embodiments the reactor itself does not interact with etching chemistries and may also not interact with substrates. In some cases reactor can comprise a hot-wall, cold-wall or warm-wall type of reaction chamber.

In some embodiments, the ALE process has an average etch rate of about 0.01 to about 5 Å/cycle. Etch rate is defined as amount of material or thickness of film is removed after each cycle. In some embodiments, the etch rate can be tuned as indicated by the figure. For practical reasons etch rate can be calculated after 1 etching cycle, after more than 2 etching cycles or more than 5 or even higher than 20 or sometimes higher than 50 cycles. In some embodiments, the amount of material removed per cycle is consistent, if not constant, over time. In some embodiments, the average etch rate is about 0.05 to 5 Å/cycle or from 0.1 to about 3 Å/cycle or in some cases even higher than 3 Å/cycle.

For plasma ALE, the etch rate can be tuned by the ion energy (e.g., FIGS. 5C and 7A).

In some embodiments the etch selectivity i.e. the ratio of material (thickness, mass or amount of atoms/molecules) removed from the desired surface/material to material removed from the non-desired surface/materials or surfaces/materials, is from more than about 2:1, more than about 3:1, more than about 5:1, more than about 7:1, more than about 10:1, more than about 15:1, more than about 20:1, more than about 30:1, more than about 50:1, more than about 100:1, more than about 1000:1, more than about 10,000 to 1, or is a detectable amount of etching:an undetectable amount of etching. In some embodiments no substantial amount of material is removed from the non-desired surface/material. In some embodiments, the desired surface for removal comprises carbon and/or SiN (that has had its oxidized surface removed). In some embodiments, the non-desired surface lacks carbon, is SiO, an oxide or SiN (with an oxide layer).

In some embodiments the flow of the first or second reactant can be equal to or higher than 2 sccm, can be equal to or greater than 10 sccm or sometimes even higher than 50 sccm or can be more than 100 sccm or more than 500 sccm. In some embodiments first reactant can be continuously flown into the reaction chamber while second reactant is flown intermittently.

In some embodiments, the cyclic etch conditions can include: a first half-cycle CCP H2 Plasma modification (exposure 60 s) at 100 MHz, 100 W, 100 sccm, 2 Pa; a second half-cycle Microwave SF6 Plasma at 2.45 GHz, 50 W, 50 sccm, 2 Pa (radicals only), which can be separated by pump/purge steps, and at a substrate temperature of 25° C.

In some embodiments, the plasma modification process can be for 30-500 s (e.g., 30, 60, 90, 100, 200, 300, 400, 500 s or longer). In some embodiments, this can depend upon the ion energy and reactor design, as system dependent parameters. In some embodiments, the plasma modification process can be at 5-30 MHz (e.g., 5, 10, 15, 20, 25 or 30, MHz). In some embodiments, the plasma modification process can be at 50-200 W (for example 50, 60, 70, 80, 90, 100, 110, 120, 130, 140, 150, 160, 170, 180, 190, or greater W). In some embodiments, the plasma modification process can be at 50-200 sccm or greater (for example 50, 60, 70, 80, 90, 100, 110, 120, 130, 140, 150, 160, 170, 180, 190, 200 sccm or greater). In some embodiments, the plasma modification process can be at 0.1 to 10 Pa, e.g., 0.1, 0.2, 0.5, 1, 2, 3, 4, 5, 6 or more Pa).

In some embodiments, the second process, whereby etching removes the modified layer can be at 1-6 GHz, (e.g., 1, 2, 3, 4, 5, or 6 GHz). In some embodiments, the second process, whereby etching removes the modified layer can be at 10-100 W (e.g., 10, 20, 30, 40, 50, 60, 70, 80, 90, or 100 W). In some embodiments, the second process, whereby etching removes the modified layer can be at 10-100 sccm (e.g., 10, 20, 30, 40, 50, 60, 70, 80, 90, or 100 sccm). In some embodiments, the second process, whereby etching removes the modified layer can be at 0.1 to 10 Pa, e.g., 0.1, 0.2, 0.5, 1, 2, 3, 4, 5, 6 or more Pa) (radicals only).

In some embodiments, a highly-selective and uniform cyclic (optionally dry) etch process of carbon (and/or nitride) containing materials is provided. The process comprises treatment of one or more surfaces with at least one of: a) plasma assisted process with ions and/or radicals, and/or b) thermal reaction with reactant gas. The process further comprises at least one of: c) plasma etching (optionally repeated cycles) of the modification layer by fluorine containing plasma, and/or d) repeated cycles of the modification layer by hydrogen containing plasma (optionally repeated cycles) and/or e) thermal etching of the modification layer (optionally repeated cycles) by fluorine containing gas. In some embodiments, the dry etch process comprises a cyclic dry etch process that provides high selectivity between carbon (and/or nitride) containing materials (which will etch) and carbon (and/or nitride) absent materials, such as oxides and nitrides.

In some embodiments, the modification layer described herein is prepared by a plasma treatment. In some embodiments, the modification layer is prepared via a plasma assisted process with ions and/or radicals, and/or a thermal reaction with reactant gas.

Although in the foregoing description the invention is illustrated with reference to certain embodiments, it is not so limited. Indeed, various modifications of the invention in addition to those shown and described herein will become apparent to those skilled in the art from the foregoing description and fall within the scope of the appended claims. All publications, patents and patent applications cited herein are hereby incorporated by reference in their entirety for all purposes to the same extent as if each individual publication, patent or patent application were specifically and individually indicated to be so incorporated by reference. Further details of the invention are provided in the following non-limiting examples.

Example 1

In some embodiments, a film containing a first SiC surface and a second SiO surface are dry etched by first subjecting the surface to a H or N containing plasma so as to form a modification layer one the SiC surface. The modification layer forms on SiC but not on SiO. The modification layer is etched by a thermal etch by $XeF_2$ or $NbF_5$ gas. And after ten cycles of atomic layer etching, there is a high selectivity of etched thickness of SiC relative to SiN.

Example 2

In some embodiments, a film containing a first SiCN surface and a second SiN surface are dry etched by forming a modification layer using $H_2$ or $NH_3$ plasma. The modification layer is etched by a thermal etch by $XeF_2$ gas. The modification layer forms on SiCN and on SiN. After twenty cycles of atomic layer etching, there is a high selectivity of etched thickness of SiCN relative to SiN.

Example 3

Using a set of starting layers of: SiN ALD layer ~30 nm thick, SiO ALD layer ~25 nm thick, SiC PECVD ~40 nm thick, and SiCOH PECVD ~200 nm thick, the layers are subjected to $H_2$ plasma treatment and $SF_6$ plasma etching under the following conditions: a) 1st half-cycle CCP $H_2$ Plasma modification (exposure 60 s) at 100 MHz, 100 W, 100 sccm, 2 Pa, b) 2nd half-cycle Microwave SF6 Plasma at 2.45 GHz, 50 W, 50 sccm, 2 Pa (radicals only), where a and b are separated by pump/purge steps, and where the substrate temperature is 25° C. The results, demonstrating selective etching between the layers, are shown in FIG. 3. The self-limiting behavior of the etch process as function of the F radical exposure can be observed in FIG. 3 as well. For the SiN layer, the removal of the surface oxide was required to obtain etching.

By not removing the surface oxide from such a layer, it is also possible to enhance the selectivity of etching between SiN and the other carbon (and/or nitrogen) containing layers.

Example 4

A starting layer of SiN (ALD) approximately 30 nm thick was etched. The process conditions were a) 1st half-cycle CCP $H_2$ plasma modification (exposure 60 s) at 100 MHz, 100 W, 100 sccm, 2 Pa with a Bias 2 MHZ, 0-20 W and b) 2nd half-cycle Microwave SF6 Plasma at 2.45 GHz, 50 W, 50 sccm, 2 Pa (radicals only). A and B were separated by pump/purge steps and the substrate temperature was 25° C.

Figure 11:
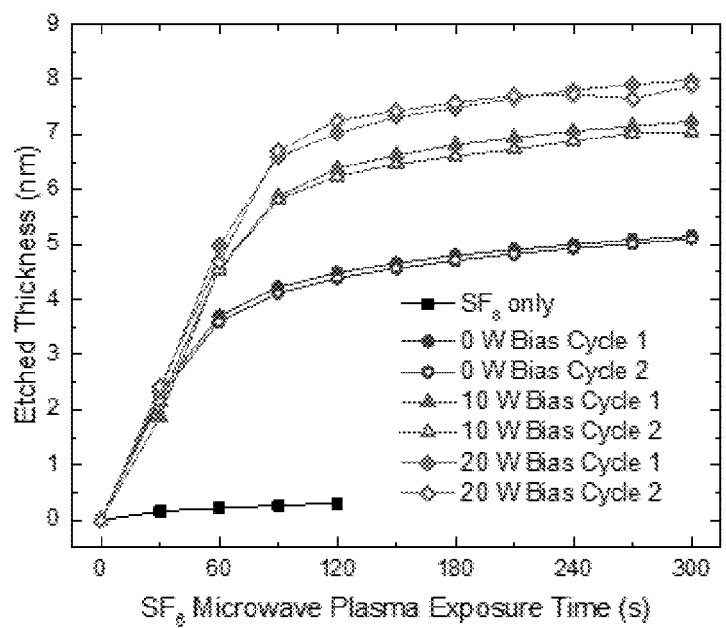
FIG. 11 is a graph providing guidance as to etched thickness as a function of the SF6 microwave plasma exposure time and bias.

The results are displayed in FIGS. 4A-5C. As shown in FIG. 4A altering the $H_2$ bias power, altered the relative etching between SiC and SiN layers. As shown in FIG. 4B, using a pre-treatment (to remove surface oxide) resulted in SiN being etched (whereas it was not significantly etched without the pre-treatment). The modification layer that was created by the $H_2$ plasma treatment is shown in FIG. 5B (dark black outline). In addition, as shown in FIG. 5C, the thickness of the modification layer is a function of the applied bias (FIG. 5C). FIG. 11 also displays additional data on bias saturation. FIG. 11 demonstrates the etched thickness as a function of the SF6 Microwave plasma exposure time. During the $H_2$ plasma half cycle a substrate bias was applied ranging from 0 to 20 W. For the $SF_6$ only sample no $H_2$ plasma was applied, showing the limited etch of SiN when no modification layer is formed.

Example 5

Figure 8A:
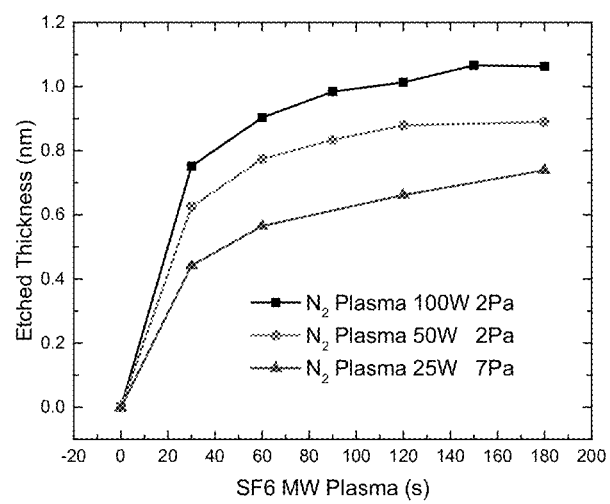
FIG. 8A is a graph illustrating etched thickness as a function of the period of time that N2 plasma and fluorine radicals are applied.
Figure 8B:
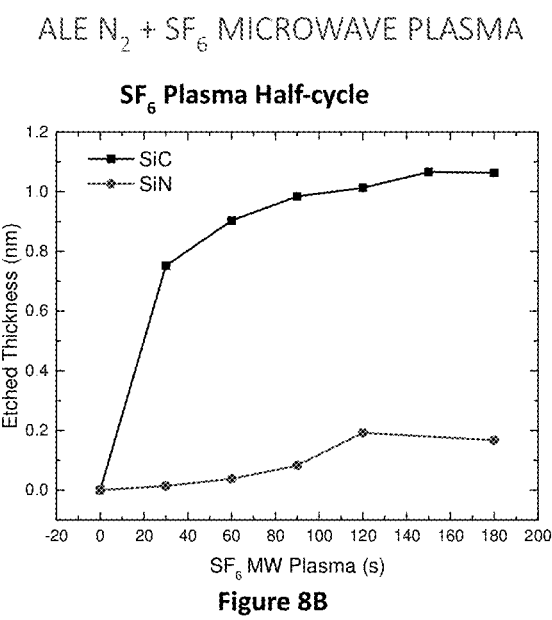
FIG. 8B is a graph depicting etch selectivity between SiN and SiC.

A starting layer of SiC (PECVD) approximately 40 nm thick was etched. The process conditions were A) 1st half-cycle CCP $N_2$ Plasma modification (exposure 120 s) at 100 MHz, 25-100 W, 100 sccm, 2-7 Pa, and B) 2nd half-cycle Microwave SF6 Plasma at 2.45 GHz, 50 W, 50 sccm, 2 Pa (radicals only). A and B were separated by pump/purge steps and the substrate temperature was 25° C. The results are shown in FIGS. 8A and 8B. FIG. 8A shows the thickness of etch per cycle as a function of bias during the plasma modification step. FIG. 8B depicts a graph showing etch selectivity between SiC and SiN when using $N_2$ plasma. For FIG. 8B, a $N_2$ plasma (100 W, 100 MHz, 2 Pa)+$SF_6$ MW (50 W, 2 MHz, 2 Pa) was used.

Throughout this application, the use of singular includes the plural unless expressly stated otherwise. In this application, the use of "or" includes "and/or", unless expressly stated otherwise. Furthermore, the terms, "include," "including," and "included," are not limiting.

What is claimed is:

1. A method of selectively etching a film on a first surface of a substrate relative to a second surface of the substrate in a reaction chamber by chemical atomic layer etching, the method comprising one or more cyclic etch processes comprising:

forming a modification layer using a first plasma; and
   etching the modification layer with a halogen containing gas,
   wherein both the first surface and the second surface are exposed to the halogen containing gas at the same time, and
   wherein the first surface and the second surface are substantially on the same planar surface.

2. The method of claim 1, wherein the first surface comprises carbon and the second surface does not comprise carbon.

3. The method of claim 1, wherein the first surface comprises nitride and the second surface does not comprise nitride.

4. The method of claim 1, wherein the halogen containing gas comprises a fluorine or a chlorine containing plasma which does not involve oxygen.

5. The method of claim 1, wherein the first plasma is a hydrogen containing plasma.

6. The method of claim 1, wherein etching the modification layer comprises a hydrogen or nitrogen containing gas.

7. The method of claim 1, wherein etching the modification layer uses a plasma.

8. The method of claim 1, wherein the dry etch process results in high selectivity between the first surface containing carbon and the second surface, which does not contain carbon.

9. The method of claim 1, wherein the cyclic dry etch process comprises modifying the substrate with a plasma comprising helium.

10. The method of claim 1, wherein the cyclic dry etch process comprises modifying the substrate with a plasma comprising nitrogen.

11. The method of claim 1, wherein the cyclic dry etch process is repeated more than one time.

12. The method of claim 2, wherein the carbon-containing material comprises silicon.

13. The method of claim 11, wherein the carbon and silicon containing material includes SiC, SiCN, SiCO or SiCOH.

14. The method of claim 2, wherein the carbon-containing material comprises metal.

15. The method of claim 13, wherein the carbon and metal containing material includes TiC, HfC, WC, MoC, AlC, or ZrC.

16. The method of claim 3, wherein the nitride-containing material comprises metal.

17. The method of claim 16, wherein the nitride and metal containing material includes TiN, HfN, WN, MoN, AN, or ZrN.

18. The method of claim 4, wherein the fluorine containing gas comprises $XeF_2$ or HF.

19. The method of claim 2, wherein the second surface comprises materials that contain oxides and nitrides.

20. The method of claim 19, wherein the oxide containing material includes at least one of titanium oxide, hafnium oxide, tungsten oxide, molybdenum oxide, aluminum oxide, or zirconium oxide.

21. The method of claim 5, wherein the hydrogen containing plasma comprises $H_2$, $NH_3$, $H_2/Ar$, or $H_2/N_2$.

22. The method of claim 10, wherein the nitrogen containing plasma comprises $N_2$, or $N_2/Ar$.

23. The method of claim 4, wherein the fluorine containing plasma comprises $SF_6$ or $NF_3$.

24. The method of claim 4, wherein the fluorine containing plasma is generated by a microwave plasma source.

25. The method of claim 6, wherein etching is achieved via a thermal reaction with reactant gas.

26. A selective and uniform cyclic dry etch process of carbon containing materials comprising:
providing a first surface that comprises silicon with carbon or metal with carbon;
providing a second surface that comprises silicon without carbon or metal without carbon;
treating both the first and second surface at the same time with at least one of:
a) a plasma assisted process with ions and/or radicals to form a plasma modified layer, or
b) a thermal reaction with reactant gas to form a plasma modified layer; and
treating both the first and the second surface at the same time with at least one of:
a) plasma etching of the modification layer by fluorine containing plasma, or
b) thermal etching of the modification layer by fluorine containing gas.

27. An atomic layer etching process for selectively etching film on a first surface of a substrate relative to a second surface of the substrate in a reaction chamber comprising:
providing a substrate comprising a first surface and a second surface, wherein the first surface comprises silicon with carbon or metal with carbon and the second surface comprises silicon without carbon or metal without carbon;
conducting at least one etch cycle comprising alternately and sequentially contacting at least a portion of both the first surface and the second surface at the same time with a modification plasma comprising helium, hydrogen or nitrogen, wherein the modification plasma forms a modification layer on the first surface; and
applying an etching reactant to both the first surface and the second surface at the same time, wherein the etching reactant comprises a fluorine containing gas, wherein the etching reactant uniformly and selectively etches the modification layer on the first surface relative to the second surface, and
wherein the first surface and the second surface are substantially on the same planar surface.

28. The method of claim 27, wherein the carbon-containing surface comprises SiC, SiCN, SiCO or SiCOH.

29. The method of claim 27, wherein the carbon-containing surface comprises TiC, HfC, WC, MoC, AlC, or ZrC.

30. The method of claim 27, wherein the non-carbon containing surfaces contain oxides and nitrides.

31. The method of claim 27, wherein the etching reactant comprises a fluorine containing plasma.

* * * * *

UNITED STATES PATENT AND TRADEMARK OFFICE
CERTIFICATE OF CORRECTION

PATENT NO. : 10,720,334 B2
APPLICATION NO. : 16/041044
DATED : July 21, 2020
INVENTOR(S) : Vervuurt et al.

Page 1 of 2

It is certified that error appears in the above-identified patent and that said Letters Patent is hereby corrected as shown below:

On the Title Page

Column 1, Item (72), Line 2, under Inventors, delete "Kwagoe" and insert --Kawagoe--.

In the Drawings

On Sheet 14 of 14, FIG. 11, Reference Number 4, Line 1, delete "$SF_8$" and insert --$SF_6$--.

In the Specification

In Column 2, Line 22, delete "N2" and insert --$N_2$--.

In Column 2, Line 28, delete "N2" and insert --$N_2$--.

In Column 2, Line 29, delete "N2" and insert --$N_2$--.

In Column 2, Line 31, delete "SiO" and insert --SiO.--.

In Column 2, Line 36, delete "SF6" and insert --$SF_6$--.

In Column 3, Line 50, delete "process" and insert --process.--.

In Column 5, Line 31, delete "conformaly" and insert --conformally--.

In Column 6, Line 3, delete "$H_2/N_2In$" and insert --$H_2/N_2$. In--.

In Column 6, Line 17, delete "BCl3 or SOCl2." and insert --$BCl_3$ or $SOCl_2$.--.

In Column 6, Line 66, delete "[etching" and insert --etching--.

Signed and Sealed this
Twentieth Day of October, 2020

Andrei Iancu
*Director of the United States Patent and Trademark Office*

CERTIFICATE OF CORRECTION (continued)
U.S. Pat. No. 10,720,334 B2

In Column 9, Line 56, delete "Pa)." and insert --Pa.--.

In Column 9, Line 67, delete "Pa)" and insert --Pa--.

In Column 11, Line 35, delete "SF6 Microwave" and insert --$SF_6$ microwave--.

In the Claims

In Column 12, Line 50, Claim 17, delete "AN," and insert --AlN,--.